United States Patent
Liu et al.

(10) Patent No.: US 9,099,528 B2
(45) Date of Patent: Aug. 4, 2015

(54) METHOD FOR MANUFACTURING THREE-DIMENSIONAL INTEGRATED CIRCUIT

(71) Applicant: Innetech (Tianjin) Electronics Co., Ltd., Tianjin (CN)

(72) Inventors: Dongsheng Liu, Tianjin (CN); Meng Wang, Tianjin (CN)

(73) Assignee: Innetech (Tianjin) Electronics Co., Ltd., Tianjin (CN)

( * ) Notice: Subject to any disclaimer, the term of this patent is extended or adjusted under 35 U.S.C. 154(b) by 0 days.

(21) Appl. No.: 14/296,419

(22) Filed: Jun. 4, 2014

(65) Prior Publication Data

US 2014/0284849 A1 Sep. 25, 2014

Related U.S. Application Data

(63) Continuation-in-part of application No. PCT/CN2012/083820, filed on Oct. 31, 2012.

(51) Int. Cl.
| | |
|---|---|
| *H01L 21/768* | (2006.01) |
| *C23C 18/32* | (2006.01) |
| *C23C 18/16* | (2006.01) |
| *C23C 18/20* | (2006.01) |
| *C23C 18/38* | (2006.01) |
| *H05K 3/18* | (2006.01) |
| *B29C 45/00* | (2006.01) |
| *C23C 18/18* | (2006.01) |

(52) U.S. Cl.
CPC .......... *H01L 21/768* (2013.01); *B29C 45/0053* (2013.01); *C23C 18/166* (2013.01); *C23C 18/1608* (2013.01); *C23C 18/1612* (2013.01); *C23C 18/1641* (2013.01); *C23C 18/1651* (2013.01); *C23C 18/1868* (2013.01); *C23C 18/204* (2013.01); *C23C 18/208* (2013.01); *C23C 18/32* (2013.01); *C23C 18/38* (2013.01); *H05K 3/185* (2013.01); *B29C 2045/0079* (2013.01); *H05K 2201/0129* (2013.01); *H05K 2201/09118* (2013.01); *H05K 2203/107* (2013.01)

(58) Field of Classification Search
CPC ....................................................... H01L 21/768
See application file for complete search history.

(56) References Cited

U.S. PATENT DOCUMENTS 6,473,238 B1 * 10/2002 Daniell ......................... 359/622

* cited by examiner

*Primary Examiner* — Seahvosh Nikmanesh
(74) *Attorney, Agent, or Firm* — Matthias Scholl P.C.; Matthias Scholl

(57) ABSTRACT

A method for manufacturing a three-dimensional integrated circuit. The method includes: 1) adding a non-metallic light-induced catalyst including an alcohol and/or an aldehyde to a thermoplastic carrier material, and molding the resulting mixture by an injection molding machine to form a structural component; 2) irradiating a surface of the structural component with a laser ray to form a line pattern thereon; 3) immersing the structural component in a metal ion solution at room temperature for between 5 and 7 minutes; 4) washing the structural component with distilled water, and immersing the structural component in an aqueous solution including a reducing agent for between 5 and 7 minutes to allow the surface of the structural component to form a metal core; and 5) performing electroless copper plating and medium-phosphorus electroless nickel plating on an area comprising the metal core to yield a conductor track.

15 Claims, No Drawings

METHOD FOR MANUFACTURING THREE-DIMENSIONAL INTEGRATED CIRCUIT

CROSS-REFERENCE TO RELATED APPLICATIONS

This application is a continuation-in-part of International Patent Application No. PCT/CN2012/083820 with an international filing date of Oct. 31, 2012, designating the United States, now pending, and further claims priority benefits to Chinese Patent Application No. 201210016388.5 filed Jan. 19, 2012. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 14781 Memorial Drive, Suite 1319, Houston, Tex. 77079.

BACKGROUND OF THE INVENTION

1. Field of the Invention

The invention relates to a method for manufacturing a three-dimensional integrated circuit.

2. Description of the Related Art

A typical method for manufacturing a three-dimensional integrated circuit includes directly adding a metal chelate to a carrier material and using laser ray to strike the active metal particles to expose them in the air. However, the method is disadvantageous in that the addition of the metal chelate to the plastic material easily results in damage of the carrier material, adversely affecting its breaking point and tensile strength. The energy of the laser ray directly affects the adherence in the metal plating process and may result in unnecessary conduction of disconnected circuits in the process of electroless copper plating and electroless nickel plating.

In the conventional method that includes adding an additive to the plastic material, the additive is not uniformly distributed in the plastic material, which is not conducive to the adhesion of the metal plating layer of the metal conductor track, thereby affecting the preparation of the metal conductor track. Furthermore, the currently used carrier material is prepared by adding copper-containing material to the carrier material.

A conventional method for manufacturing metal conductor track includes: striking copper plating for 30 minutes, a first multiple-washing, copper plating for 180 minutes, a second multiple-washing, and electroless nickel plating. During the metallization process of the metal conductor track, a large amount of formaldehyde is used as a reducing agent. As formaldehyde is a dangerous environmental pollutant, it is important to limit its use.

SUMMARY OF THE INVENTION

In view of the above-described problems, it is one objective of the invention to provide a method for manufacturing a three-dimensional integrated circuit. The method of the invention is characterized in that: no metal elements exist in the carrier material of the three-dimensional integrated circuit, but the metal elements exist in the whole electroless plating process. The method for manufacturing the three-dimensional integrated circuit comprises irradiating the surface of the carrier material with a laser ray to form a specific region needing metallization and further comprises transforming a non-metallic light-induced catalyst in the raw material into groups possessing complexation capability to play catalytic action in subsequent metallization process. The principle and method of the invention is very different from conventional methods that adopt carrier material comprising metal elements and utilize the laser ray to reduce metal elements in the plastic for metallization.

In the method, a small amount of non-metallic light-induced catalyst comprising an alcohol or an aldehyde is added to the carrier material so that the non-metallic light-induced catalyst is transformed into a catalyst structural component having the complexation capability after the laser irradiation. In a solution comprising metal ions, the metal ions possessing the complexation capability react with the catalyst possessing complexation capability on the surface of the plastic to form a stable complex. Thereafter, the complex is reduced to yield a metal core. Thus, the original stable mechanical performance of the carrier material is maintained during the manufacture process of the conductor track. The adhesion force between the conductor track and the carrier material, and the quality of the three-dimensional integrated circuit are improved, and the production cost and the pollution are decreased.

To achieve the above objective, in accordance with one embodiment of the invention, there is provided a method for manufacturing a three-dimensional integrated circuit, the method comprising:

1) providing a thermally stable material being selected from a group consisting of an engineering thermoplastic acrylonitrile-butadiene-styrene (ABS), polycarbonate (PC), and polybutylene terephthalate (PBT), and a mixture thereof; providing a non-metallic light-induced catalyst being in a solid or liquid state and selected from a group consisting of a solid or liquid monohydric alcohol, dihydric alcohol, trihydric alcohol, monoaldehyde, dialdehyde, trialdehyde, a compound thereof, and a mixture thereof; and mechanically mixing the non-metallic light-induced catalyst and the thermally stable material at a temperature of between 150 and 250° C. to yield a plastic comprising the non-metallic light-induced catalyst;

2) molding the plastic comprising the non-metallic light-induced catalyst by an injection molding machine to form a structural component;

3) irradiating a surface of the structural component with a laser ray to form a line pattern thereon, during which, at least between 30 and 50 wt. % of hydroxyl groups or aldehyde groups of the non-metallic light-induced catalyst are transformed into carboxyl groups as a result of the heat energy of the laser ray and the oxygen in the air. Generally, the carboxyl has an excellent complexation capability with various metal ions. According to characteristics of different modified materials, a wavelength of the laser ray is between 248 nm and 10600 nm, a modulation frequency thereof is between 1 and 1000 K, a pulse width is between 4 and 200 ns, and an average power thereof is between 0.5 and 100 W.

4) immersing the structural component into a metal ion solution (also called a solution A) comprising metal ions and having a pH value of between 4 and 6 for between 5 and 7 minutes. The carboxyl groups of the non-metallic light-induced catalyst on the plastic surface of the laser irradiated region and the silver and nickel metal ions in the metal ion solution, both having complexation capabilities, react with each other to form stable complexes.

The metal ions having the complexation capability in the solution A in step 4) comprise metal ions in the periodic table of elements except for the first and the second main groups. The metal ions in the metal ion solution are a trace amount of Pd, between 0.1 and 2 wt. % of silver, between 1 and 20 wt. % of Ni, Co, Fe, Cu, or Zn, or a mixture thereof, or a complex thereof.

5) reducing the complex obtained in step 4) by an aqueous solution (solution B) comprising a reducing agent to form a metal core; the metal core has a stable performance during the preparation of the conductor track, the adhesion force between the conductor track and the carrier material is increased, and the quality of the three-dimensional integrated circuit is further improved.

The reducing agent of the solution B is an inorganic compound or an organic compound having a relatively strong reducing capability, or a mixture thereof. For example, hydrazine, a borohydride compound, a hypophosphite, a thiosulfate, diamide, or stannous chloride.

6) performing electroless copper plating and medium-phosphorus electroless nickel plating respectively on an area comprising the metal core to form a metal conductor track.

The electroless copper plating is performed in a copper plating solution in the presence of air agitation at 60° C. A velocity for the electroless copper plating is between 2 and 5 μm/hr. The copper plating solution comprises: anhydrous copper sulfate having a concentration of 12 g/L, potassium sodium tartrate having a concentration of 43 g/L, disodium ethylenediamine tetraacetate having a concentration of 14 g/L, formaldehyde having a concentration of 21 mL/L, potassium ferrocyanide having a concentration of 36 mg/L, and bipyridine having a concentration of 0.06 g/L, and the pH value thereof is maintained at 12 by adding sodium hydroxide.

The medium-phosphorus electroless nickel plating is performed in a medium-phosphorus electroless nickel solution. A velocity for the electroless nickel plating is between 5 and 13 μm/hr, and a plating thickness is between 2 and 3 μm. The medium-phosphorus electroless nickel solution comprises: nickel sulfate having a concentration of 27 g/L, sodium hypophosphite having a concentration of 24 g/L, sodium acetate having a concentration of 15 g/L, lactic acid having a concentration of 30 g/L, citric acid having a concentration of 4 g/L, and sodium dodecyl sulfate having a concentration of 1 g/L. The medium-phosphorus electroless nickel solution is prepared at a temperature of between 80 and 86° C., and a PH value thereof is adjusted to be between 4.8 and 5.

A thickness of an electroless copper plating layer is between 1 and 12 μm, and preferably between 8 and 12 μm. A time for the electroless copper plating is between 200 and 300 minutes.

The structural component is a casing of a cell phone, an antenna of a cell phone, or an electronic module or an electric connection piece of other three-dimensional integrated circuits.

The non-metallic light-induced catalyst is in a solid or liquid state at room temperature and is selected from the group consisting of the monohydric alcohol, the dihydric alcohol, the trihydric alcohol, the monoaldehyde, the dialdehyde, the trialdehyde, the compound thereof, and the mixture thereof.

To the thermoplastic carrier material, some other non-metallic light-induced catalysts are added. The non-metallic light-induced catalysts comprise an alkane, alkene, alkyne, ether, ketone, ester, and heterocyclic compounds that are able to be oxidized into acids in certain conditions. The thermoplastic carrier material is a mixture comprising at least two of ABS, PC, and PBT.

The method is applicable to manufacture the three-dimensional and two-dimensional integrated circuit.

The electroless plating method of the invention deletes the striking process of pre-copper plating and directly performs electroless plating on the carrier material by using the common electroless plating methods, that is, the electroless copper plating and electroless nickel-phosphorus plating process, for increasing the plating thickness and forming the three-dimensional circuit.

In the electroless plating solution, the metal ions possessing the complexation capability are added and the metal ions are a trace amount of Pd, between 0.1 and 2 wt. % of silver, Ni, Co, Fe, Cu, or Zn, or a mixture thereof. As the addition of the precious metals is decreased, the production cost is decreased by between 5% and 15%. The catalyst activity and the selectivity are highly improved during the electroless copper plating due to the addition of various of metal elements.

Advantages according to embodiments of the invention are summarized as follows:

The method for manufacturing the three-dimensional integrated circuit focuses on the improvements on the principal and the process of the metallization of the carrier material. The method of the invention is characterized in that no metal elements exist in the carrier material of the three-dimensional integrated circuit, but the metal elements exist in the whole electroless plating process. The method comprises irradiating the surface of the carrier material with the laser ray to form the specific region needing metallization, and transforming non-metallic light-induced catalyst of the raw material into groups possessing complexation capability to play catalytic action in subsequent metallization process. The principle and method of the invention is very different from conventional methods that adopt carrier material comprising metal elements and utilize the laser ray to reduce metal elements in the plastic for metallization. In the method, a small amount of the non-metallic light-induced catalyst comprising the alcohol or the aldehyde is added to the carrier material so that the non-metallic light-induced catalyst is transformed into the catalyst structural component having the complexation capability after the laser irradiation. In the solution comprising metal ions, the metal ions possessing the complexation capability first react with the catalyst possessing complexation capability on the surface of the plastic to form the stable complex. Thereafter, the complex is reduced to yield the metal core. Thus, the original stable mechanical performance of the carrier material is maintained during the manufacture process of the conductor track. The adhesion force between the conductor track and the carrier material, and the quality of the three-dimensional integrated circuit are improved while the production cost and the pollution are decreased.

DETAILED DESCRIPTION OF THE EMBODIMENTS

For further illustrating the invention, experiments detailing a method for manufacturing a three-dimensional integrated circuit are described below. It should be noted that the following examples are intended to describe and not to limit the invention.

Example 1

90 wt. % of PBT and 10 wt. % of glycerol (1,2,3-trihydroxy propanol) were uniformly mixed in an injection molding machine (Sumitomo SH160C manufactured by Sumitomo Heavy Industries, Ltd.). The resulting mixture was injection molded at 175° C. to form a cell phone casing. The cell phone casing was then irradiated with a laser ray having a wavelength of 1064 nm by using an ND:YAG laser for 0.01 second to form a loop shape of a cell phone antenna and to transform the hydroxyl groups of the non-metallic light-induced catalyst of the carrier material within the irradiated region into carboxyl groups that possess complexation capability.

The carrier material was immersed into a metal ion solution comprising 14 wt. % of nickel chloride and 1 wt. % of silver nitrate and having a pH value of 4 at room temperature for 5 minutes. The carboxyl groups of the non-metallic light-induced catalyst on the plastic surface of the laser irradiated region and the silver and nickel metal ions in the metal ion solution, both having complexation capabilities, reacted to form stable complexes. The existence of the nickel complexes and the silver complexes were demonstrated by the in situ spectro electrochemical measurements (Electrochemical Methods; Fundamentals and Applications; Allen J. Bard etc. 1980).

The carrier material was washed by distilled water and was then immersed into an aqueous solution having a pH value of 5 and comprising 25 wt. % of sodium hypophosphite and 8 wt. % of hydrazine to reduce the nickel complexes and the silver complexes into metal cores.

Thereafter, the carrier material was washed by distilled water again, and electroless copper plating and medium-phosphorus (7 wt. %<P<10 wt. %) electroless nickel plating were respectively conducted to yield a metal conductor track on the irradiated region.

Specifically, a copper plating solution comprised: anhydrous copper sulfate having a concentration of 12 g/L, potassium sodium tartrate having a concentration of 43 g/L, disodium ethylenediamine tetraacetate having a concentration of 14 g/L, formaldehyde (37 wt. %) having a concentration of 21 mL/L, potassium ferrocyanide having a concentration of 36 mg/L, and bipyridine having a concentration of 0.06 g/L. The copper plating solution was air agitated at the temperature of 60° C. Thereafter, sodium hydroxide was added to the copper plating solution to adjust the pH value to be 12. The electroless copper plating was performed in the copper plating solution and lasted for 220 minutes. A thickness of the copper plating layer was 11 μm.

Specifically, a medium-phosphorus nickel plating solution comprised: nickel sulfate having a concentration of 27 g/L, sodium hypophosphite having a concentration of 24 g/L, sodium acetate having a concentration of 15 g/L, lactic acid having a concentration of 30 g/L, citric acid having a concentration of 4 g/L, and sodium dodecyl sulfate having a concentration of 1 g/L. The medium-phosphorus nickel plating solution was prepared at the temperature of between 84 and 86° C. Thereafter, the PH value of the medium-phosphorus nickel plating solution was adjusted to be between 4.8 and 5. The medium-phosphorus electroless nickel plating was performed in the medium-phosphorus electroless nickel solution and lasted for 15 minutes, and a thickness of the nickel plating layer was 2 μm.

In this example, nickel chloride in the metal ion solution can be replaced by nickel nitrate while other conditions remain the same.

Example 2

The method for manufacturing a three-dimensional integrated circuit is the same as that in Example 1 except that 83 wt. % of PBT, 11 wt. % of nano titanium dioxide, and 6 wt. % of 2-methyl propanal were mixed in an injection molding machine to yield a mixture; the mixture was processed to form a cell phone casing at the temperature of between 180 and 185° C.; and a specific shaped region on the cell phone casing was irradiated to transform formyl groups of the non-metallic light-induced catalyst of the carrier material into carboxyl groups.

Example 3

86 wt. % of ABS-PC, 9 wt. % of nano titanium dioxide, and 5 wt. % of propanol were uniformly mixed in an injection molding machine (Sumitomo SH160C manufactured by Sumitomo Heavy Industries, Ltd.). The resulting mixture was injection molded at the temperature of 175° C. to form a cell phone casing. The cell phone casing was then irradiated with a laser ray having a wavelength of 1064 nm by using an ND: YAG laser for 0.01 second to form a shape of a cell phone antenna and to transform the hydroxyl groups of the non-metallic light-induced catalyst of the carrier material within the specific shaped irradiated region into carboxyl groups.

The carrier material was immersed into a metal ion solution comprising 10 wt. % of nickel nitrate and 1 wt. % of silver nitrate and having a pH value of 4 at room temperature for 5 minutes. The carboxyl groups of the non-metallic light-induced catalyst on the plastic surface of the laser irradiated region reacted with the silver and nickel metal ions in the metal ion aqueous to form stable complexes.

The carrier material was washed by distilled water and was then immersed into an aqueous solution having a pH value of 5 and comprising 25 wt. % of sodium hypophosphite and 8 wt. % of hydrazine to reduce the nickel complexes and the silver complexes into metal cores.

Thereafter, the carrier material was washed by distilled water again, and thereafter, electroless copper plating and low-phosphorus (P<7 wt. %) electroless nickel plating were respectively conducted to yield a metal conductor track on the irradiated region.

Specifically, a copper plating solution comprised: anhydrous copper sulfate having a concentration of 12 g/L, potassium sodium tartrate having a concentration of 43 g/L, disodium ethylenediamine tetraacetate having a concentration of 10 g/L, formaldehyde (37 wt. %) having a concentration of 21 mL/L, potassium ferrocyanide having a concentration of 36 mg/L, and bipyridine having a concentration of 0.06 g/L. The copper plating solution was then air agitated at the temperature of 60° C. Thereafter, sodium hydroxide was added to the copper plating solution to adjust the pH value to be 13. The electroless copper plating was carried out in the copper plating solution and lasted for 200 minutes. A thickness of the copper plating layer was 11 μm.

Specifically, a low-phosphorus electroless nickel solution comprised: nickel sulfate having a concentration of 27 g/L, sodium hypophosphite having a concentration of 20 g/L, sodium acetate having a concentration of 15 g/L, lactic acid having a concentration of 30 g/L, citric acid having a concentration of 4 g/L, and sodium dodecyl sulfate having a concentration of 1 g/L. The low-phosphorus electroless nickel solution was prepared at the temperature of between 80 and 82° C., and thereafter, the pH value of the low-phosphorus electroless nickel solution was adjusted to be between 5.6 and 6. The low-phosphorus electroless nickel plating was performed in the low-phosphorus electroless nickel solution and lasted for 25 minutes, and a thickness of the nickel plating layer was 2 μm.

Example 4

The method for manufacturing a three-dimensional integrated circuit is the same as that in Example 3 except that 84 wt. % of PBT, 10 wt. % of nano titanium dioxide, and 6 wt. % of 3,4-dimethyl-1-pentene were mixed in an injection molding machine to yield a mixture; the mixture was then processed at the temperature of between 183 and 185° C. to form a cell phone casing; and a specific shaped region on the cell phone casing was irradiated to transform alkenyl groups of the non-metallic light-induced catalyst of the carrier material into carboxyl groups.

From comparisons of breaking point and tensile strength between products manufactured by methods according to Examples 1-4 and plastic material comprising metal elements (material table of 10302 materials disclosed by SABIC Innovative Plastics), as shown in Tables 1-2, it was known that the mechanical performance of the product manufactured by the method of the invention is highly improved in relation to those manufactured by the conventional process.

TABLE 1

Comparison of breaking point between products manufactured by methods according to Examples 1-4 and plastic material comprising metal elements disclosed by SABIC Innovative Plastics

| Example | Breaking point (containing metal elements) | Breaking point (not containing metal elements) | Mechanical performance |
|---|---|---|---|
| 1 | 100% | 135% | Increased by 35% |
| 2 | 101% | 146% | Increased by 44% |
| 3 | 102% | 151% | Increased by 48% |
| 4 | 101% | 142% | Increased by 40% |

TABLE 2

Comparison of tensile strength between products manufactured by methods according to Examples 1-4 and plastic material comprising metal elements disclosed by SABIC Innovative Plastics

| Example | Tensile strength (containing metal elements) | Tensile strength (not containing metal elements) | Mechanical performance |
|---|---|---|---|
| 1 | 80 MPa | 87 MPa | Increased by 7 MPa |
| 2 | 80 MPa | 88 MPa | Increased by 8 MPa |
| 3 | 80 MPa | 86 MPa | Increased by 6 MPa |
| 4 | 80 MPa | 87 MPa | Increased by 7 MPa |

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A method for manufacturing a three-dimensional integrated circuit, the method comprising:
   1) adding a non-metallic light-induced catalyst comprising an alcohol and/or an aldehyde to a thermoplastic carrier material to yield a mixture, and molding the mixture by an injection molding machine to form a structural component, the non-metallic light-induced catalyst accounting for between 5 and 10 wt. % of the mixture;
   2) irradiating a surface of the structural component with a laser ray to form a line pattern thereon;
   3) immersing the structural component in a metal ion solution at room temperature for between 5 and 7 minutes, the metal ion solution having a PH value of between 4 and 6 and comprising at least one metal ion;
   4) washing the structural component by distilled water, and immersing the structural component in an aqueous solution comprising a reducing agent for between 5 and 7 minutes to allow the surface of the structural component to form a metal core; and
   5) performing electroless copper plating on an area comprising the metal core to yield a first plating layer having a thickness of between 1 and 12 μm, and performing medium-phosphorus electroless nickel plating to yield a second plating layer having a thickness of between 2 and 3 μm.

2. The method of claim 1, wherein the thermoplastic carrier material is acrylonitrile-butadiene-styrene (ABS), polycarbonate (PC), or polybutylene terephthalate (PBT).

3. The method of claim 1, wherein the alcohol is in a solid or liquid state and is a monohydric alcohol, a dihydric alcohol, or a trihydric alcohol.

4. The method of claim 1, wherein the aldehyde is in a solid or liquid state and is a monoaldehyde, a dialdehyde, or a trialdehyde.

5. The method of claim 1, wherein a wavelength of the laser ray is between 248 nm and 10600 nm; a modulation frequency thereof is between 1 and 1000 K; a pulse width is between 4 and 200 ns; and an average power thereof is between 0.5 and 100 W.

6. The method of claim 1, wherein the metal ion in the metal ion solution is palladium, between 0.1 and 2 wt. % of silver, between 1 and 20 wt. % of Ni, Co, Fe, Cu, or Zn, or a mixture thereof.

7. The method of claim 1, wherein the reducing agent is hydrazine, a borohydride compound, a hypophosphite, a thiosulfate, diamide, or stannous chloride.

8. The method of claim 1, wherein
   the electroless copper plating is performed in a copper plating solution in the presence of air agitation at 60° C.;
   a velocity for the electroless copper plating is between 2 and 5 μm/hr;
   the copper plating solution comprises: anhydrous copper sulfate having a concentration of 12 g/L, potassium sodium tartrate having a concentration of 43 g/L, disodium ethylenediamine tetraacetate having a concentration of 14 g/L, formaldehyde having a concentration of 21 mL/L, potassium ferrocyanide having a concentration of 36 mg/L, and bipyridine having a concentration of 0.06 g/L; and
   a PH value of the copper plating solution is maintained at 12 by adding sodium hydroxide.

9. The method of claim 1, wherein
   the medium-phosphorus electroless nickel plating is performed in a medium-phosphorus electroless nickel solution having a pH value of between 4.8 and 5 at a temperature of between 80 and 86° C.;
   a velocity for the electroless nickel plating is between 5 and 13 μm/hr; and
   the medium-phosphorus electroless nickel solution comprises: nickel sulfate having a concentration of 27 g/L, sodium hypophosphite having a concentration of 24 g/L, sodium acetate having a concentration of 15 g/L, lactic acid having a concentration of 30 g/L, citric acid having a concentration of 4 g/L, and sodium dodecyl sulfate having a concentration of 1 g/L.

10. The method of claim 1, wherein the non-metallic light-induced catalyst is an alkane, alkene, alkyne, ether, ketone, ester, or heterocyclic compound that is able to be oxidized into an acid.

11. The method of claim 10, wherein the non-metallic light-induced catalyst is 3,4-dimethyl-1-pentene.

12. The method of claim 1, wherein the thermoplastic carrier material is a mixture of ABS, PC, and PBT.

13. The method of claim 1, wherein the non-metallic light-induced catalyst is 1,2,3-trihydroxy propanol, 2-methyl propanal, or propanol.

14. A method for manufacturing a three-dimensional integrated circuit, the method comprising:
1) adding 1,2,3-trihydroxy propanol or 2-methyl propanal to a thermalplastic carrier material comprising ABS, PC, or PBT to form a mixture, molding the mixture by an injection molding machine to form a structural component, 1,2,3-trihydroxy propanol or 2-methyl propanal accounting for between 5 and 10 wt. % of the mixture;
2) irradiating a surface of the structural component with a laser ray having a wavelength of 1064 nm for 0.01 second to form a line pattern thereon;
3) immersing the structural component in a metal ion solution at room temperature for between 5 and 7 minutes; the metal ion solution having a pH value of between 4 and 6 and comprising 14 wt. % of nickel chloride and 1 wt. % of silver nitrate;
4) washing the structural component by distilled water, and immersing the structural component in an aqueous solution for 7 minutes to enable corresponding metal core to deposit on the surface of the structural component; the aqueous solution having a pH value of 5 and comprising 25 wt. % of sodium hypophosphite and 8 wt. % of hydrazine; and
5) performing electroless copper plating to yield a first plating layer having a thickness of between 8 and 12 μm, and performing medium-phosphorus electroless nickel plating to yield a second plating layer having a thickness of between 2 and 3 μm;

wherein
the electroless copper plating is performed in a copper plating solution in the presence of air agitation at 60° C.; a velocity for the electroless copper plating is between 2 and 5 μm/hr;
the copper plating solution comprises: anhydrous copper sulfate having a concentration of 12 g/L, potassium sodium tartrate having a concentration of 43 g/L, disodium ethylenediamine tetraacetate having a concentration of 14 g/L, formaldehyde having a concentration of 21 mL/L, potassium ferrocyanide having a concentration of 36 mg/L, and bipyridine having a concentration of 0.06 g/L;
a pH value of the copper plating solution is maintained at 12 by adding sodium hydroxide;
the medium-phosphorus electroless nickel plating is performed in a medium-phosphorus electroless nickel solution having a pH value of between 4.8 and 5 at between 80 and 86° C.; a velocity for the electroless nickel plating is between 5 and 13 μm/hr; and
the medium-phosphorus electroless nickel solution comprises: nickel sulfate having a concentration of 27 g/L, sodium hypophosphite having a concentration of 24 g/L, sodium acetate having a concentration of 15 g/L, lactic acid having a concentration of 30 g/L, citric acid having a concentration of 4 g/L, and sodium dodecyl sulfate having a concentration of 1 g/L.

15. The method of claim 14, wherein nickel chloride in the metal ion solution is replaced by nickel nitrate.

\* \* \* \* \*